(12) United States Patent
Zhu

(10) Patent No.: US 10,217,804 B2
(45) Date of Patent: Feb. 26, 2019

(54) DRIVING AND SCANNING CIRCUIT, DISPLAY SCREEN AND MOBILE TERMINAL

(71) Applicant: Huizhou TCL Mobile Communication Co., LTD, Hui Zhou (CN)

(72) Inventor: Jianfeng Zhu, Hui Zhou (CN)

(73) Assignee: HUIZHOU TCL MOBILE COMMUNICATION CO., LTD, Hui Zhou (CN)

( * ) Notice: Subject to any disclaimer, the term of this patent is extended or adjusted under 35 U.S.C. 154(b) by 0 days.

(21) Appl. No.: 15/505,530

(22) PCT Filed: Aug. 17, 2016

(86) PCT No.: PCT/CN2016/095735
§ 371 (c)(1),
(2) Date: Feb. 21, 2017

(87) PCT Pub. No.: WO2017/101482
PCT Pub. Date: Jun. 22, 2017

(65) Prior Publication Data
US 2018/0219049 A1    Aug. 2, 2018

(30) Foreign Application Priority Data
Dec. 15, 2015 (CN) .......................... 2015 1 0937651

(51) Int. Cl.
*H01L 27/32* (2006.01)
*G09G 3/3266* (2016.01)
(Continued)

(52) U.S. Cl.
CPC .......... *H01L 27/323* (2013.01); *G06F 3/0412* (2013.01); *G06F 3/0416* (2013.01);
(Continued)

(58) Field of Classification Search
CPC ............... H01L 27/323; H01L 27/3262; H01L 27/3266; H01L 27/3258; H01L 51/5206; H01L 51/5221
See application file for complete search history.

(56) References Cited

U.S. PATENT DOCUMENTS

2007/0216657 A1    9/2007   Konicek
2014/0117862 A1*   5/2014   Qing ........................ G09G 3/30
                                                           315/172
(Continued)

FOREIGN PATENT DOCUMENTS

CN    103413523 A    11/2013
CN    104835469 A     8/2015
(Continued)

*Primary Examiner* — Phuc T Dang
(74) *Attorney, Agent, or Firm* — Shimokaji IP

(57) ABSTRACT

A driving and scanning circuit, a display screen and a mobile terminal, comprise driving and scanning units which are distributed in an array, each comprising an AMOLED driving unit for driving an OLED to emit light and a fingerprint scanning unit for forming pixel capacitances, wherein the AMOLED driving unit comprises a first thin film transistor, a second thin film transistor, a third thin film transistor and an OLED, the first thin film transistor is connected with a driving voltage and a first switching voltage, the second thin film transistor and the third thin film transistor are respectively connected with an anode terminal and a cathode terminal, and the OLED is positioned between the cathode terminal and the second thin film transistor; the cathode terminal also comprises a fourth thin film transistor connected with a second driving voltage and a second switching voltage.

20 Claims, 2 Drawing Sheets

(51) Int. Cl.
  *G06F 3/041* (2006.01)
  *G06F 3/0488* (2013.01)
  *G09G 3/3258* (2016.01)
  *H01L 51/52* (2006.01)
  *G09G 3/3233* (2016.01)
  *G06K 9/00* (2006.01)
  *G06F 3/044* (2006.01)

(52) U.S. Cl.
  CPC ....... *G06F 3/0488* (2013.01); *G06K 9/00006* (2013.01); *G09G 3/3233* (2013.01); *G09G 3/3258* (2013.01); *G09G 3/3266* (2013.01); *H01L 27/3262* (2013.01); *H01L 51/5206* (2013.01); *H01L 51/5221* (2013.01); *G06F 3/044* (2013.01); *G06F 2203/04806* (2013.01); *G06F 2203/04808* (2013.01); *H04M 2250/22* (2013.01)

(56) References Cited

U.S. PATENT DOCUMENTS

2016/0232846 A1* 8/2016 Xu ................. G09G 3/3258
2017/0039942 A1* 2/2017 Han ................. G09G 3/32

FOREIGN PATENT DOCUMENTS

| CN | 104981908 A | 10/2015 |
| CN | 105355171 A | 2/2016 |

\* cited by examiner

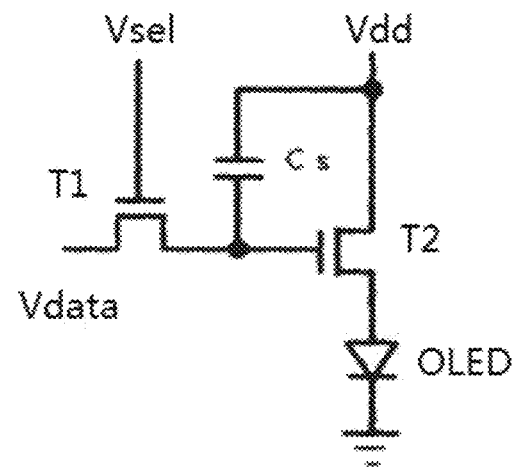
Fig. 1 - PRIOR ART
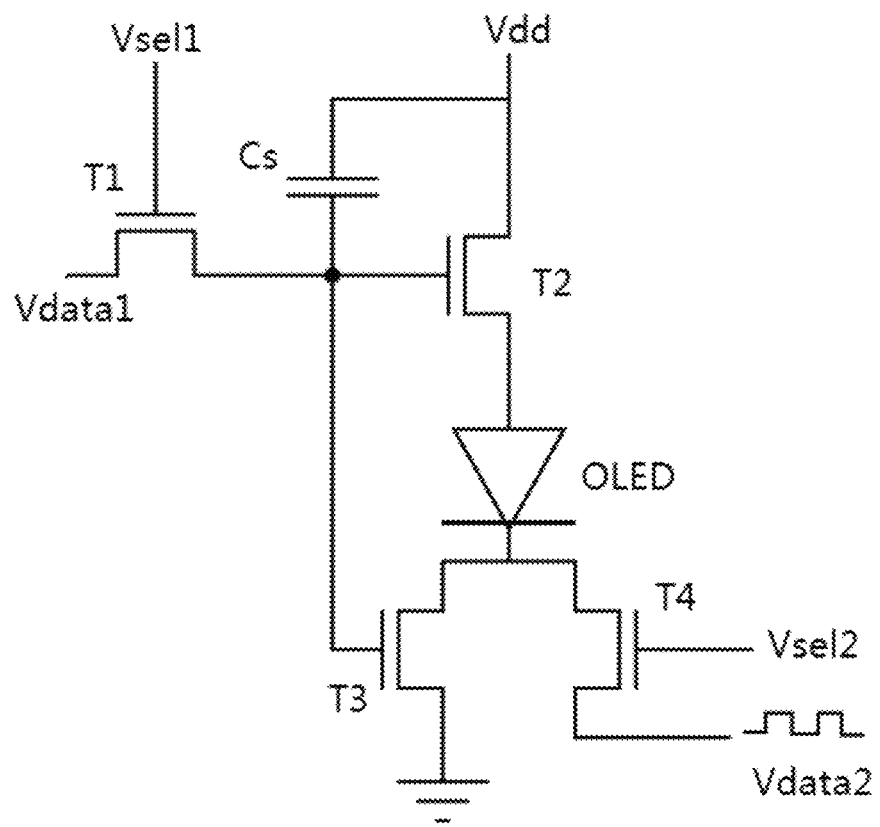
Fig. 2

DRIVING AND SCANNING CIRCUIT, DISPLAY SCREEN AND MOBILE TERMINAL

TECHNICAL FIELD

The present invention relates to the technical field of liquid crystal display, and more particularly, relates to an AMOLED (Active-matrix organic light emitting diode) and fingerprint recognition-based driving and scanning circuit, a display screen, and a mobile terminal.

BACKGROUND ART

As a new generation of display technology, AMOLED has the advantages of low power consumption, high color gamut, high brightness, high resolution, wide viewing angle, high response speed, and is therefore popular in the market.

Currently, an AMOLED self-luminous display screen has been gradually and widely used in order to reach a higher display effect and lower power consumption in many mobile phones. Through an active AMOLED light-emitting circuit, it can be found that there are many similarities between its structure and a fingerprint recognition structure, and an inherent fingerprint recognition circuit pattern can be formed through the integration of the circuits. For an AMOLED-based display panel, the top layer may be a cathode layer, which can be made from a transparent ITO conductive material to form a cell, the next layer may be an organic layer, which may be mainly made from a light-emitting material emitting RGB three primary colors, and the bottom layer may be an anode layer and a TFT circuit matrix. The current industry standard of fingerprint pixel recognition may be 508 ppi, and the AMOLED may fully meet the relevant standards.

With the popularity of fingerprint recognition in a mobile phone terminal, more and more fingerprint schemes are designed in actual products, but the relevant fingerprint recognition and operation can only be realized in a small part of the mobile phone due to the complicated structures or realization principles of all fingerprints. At present, the ability of fingerprint recognition may be only limited to the research and development of penetrating power on glass or related separators.

Therefore, it is necessary to provide an AMOLED and fingerprint recognition-based driving and scanning circuit, a display screen, and a mobile terminal in view of the above-mentioned technical problems.

SUMMARY OF THE INVENTION

In order to overcome the shortcomings of the prior art, an object of the present invention is to provide a driving and scanning circuit, a display screen, and a mobile terminal so as to achieve fingerprint recognition and relevant effective action in any display area of a mobile phone screen.

In order to achieve the above-mentioned object, the technical solution provided by the example of the present invention is as follows:

In an embodiment, a driving and scanning circuit comprises a plurality of driving and scanning units which are distributed in an array, each comprising an AMOLED driving unit for driving an OLED to emit light and a fingerprint scanning unit for forming pixel capacitances, wherein the AMOLED driving unit comprises a first thin film transistor, a second thin film transistor, a third thin film transistor and an OLED, the first thin film transistor being connected with a first driving voltage and a first switching voltage, the second thin film transistor and the third thin film transistor being respectively connected with an anode terminal and a cathode terminal, and the OLED being positioned between the cathode terminal and the second thin film transistor;

the cathode terminal also comprises a fourth thin film transistor, the fourth thin film transistor being connected with a second driving voltage and a second switching voltage;

and the one and only one of the AMOLED driving unit and the fingerprint scanning unit being in a conducting state.

As a further improvement of the present invention, the driving circuit comprises:

a first state, the first driving voltage and the first switching voltage controlling the first thin film transistor, the second thin film transistor and the third thin film transistor to be turned on, the second driving voltage and the second switching voltage controlling the fourth thin film transistor to be cut off, and the AMOLED driving unit driving the OLED to be turned on to emit light; and a second state, the first driving voltage and the first switching voltage controlling the first thin film transistor, the second thin film transistor and the third thin film transistor to be cut off, the second driving voltage and the second switching voltage controlling the fourth thin film transistor to be turned on, and the fourth thin film transistor forming pixel capacitances for fingerprint recognition.

As a further improvement of the invention, in the AMOLED driving unit:

the gate of the first thin film transistor is connected with the first switching voltage, and the source and the drain are respectively connected with the first driving voltage and the second thin film transistor;

the gate of the second thin film transistor is connected with the first thin film transistor, and the source and the drain are respectively connected with a high level of an anode and the OLED;

the gate of the third thin film transistor is connected with the gate of the second thin film transistor, and the source and the drain are respectively connected with the OLED and a low level of a cathode.

As a further improvement of the present invention, the low level of the cathode is a grounding zero level.

As a further improvement of the present invention, in the fingerprint scanning unit:

the gate of the fourth thin film transistor is connected with the second switching voltage, and the source and the drain are respectively connected with the OLED and the second driving voltage.

As a further improvement of the present invention, a capacitor for driving the second thin film transistor is arranged between the gate of the second thin film transistor and the high level of the anode.

As a further improvement of the present invention, the first switching voltage and the first driving voltage are respectively connected with a first scanning line and a first signal line, and the second switching voltage and the second driving voltage are respectively connected with a second scanning line and a second signal line.

Accordingly, the present invention relates to a display screen, comprising a cathode layer, an anode layer, an organic light-emitting layer, and the above-mentioned driving and scanning circuit.

Accordingly, the present invention relates to a mobile terminal, comprising the above-mentioned driving and scanning circuit.

As a further improvement of the present invention, the mobile terminal at least comprises a driving display state and a fingerprint scanning state, wherein:

When the mobile terminal is in a driving display state, the AMOLED driving unit in the driving and scanning circuit is used to drive the OLED to emit light so as to realize the display function of the mobile terminal;

when the mobile terminal is in a fingerprint scanning state, the fingerprint scanning unit in the driving and scanning circuit forms a capacitance matrix of pixels per unit needed by the fingerprint, and the fingerprint is acquired by using a capacitance algorithm so as to realize the fingerprint recognition and related effective action in any display area of the mobile terminal.

The fingerprint scanning unit is added at the cathode terminal of the AMOLED driving circuit in the driving and scanning circuit of the present invention, so that the driving display function of the AMOLED can not only be realized but also the fingerprint recognition function can be realized; and the fingerprint recognition and the effective operations related to the fingerprint recognition can be realized in any area of the display panel.

BRIEF DESCRIPTION OF THE DRAWINGS

FIG. 1 is a schematic circuit diagram of each of driving units of an AMOLED driving circuit in the prior art.

FIG. 2 is a schematic circuit diagram of each of driving and scanning units in a driving and scanning circuit according to an embodiment of the present invention.

DETAILED DESCRIPTION OF THE PREFERRED EMBODIMENTS

Figure 3:
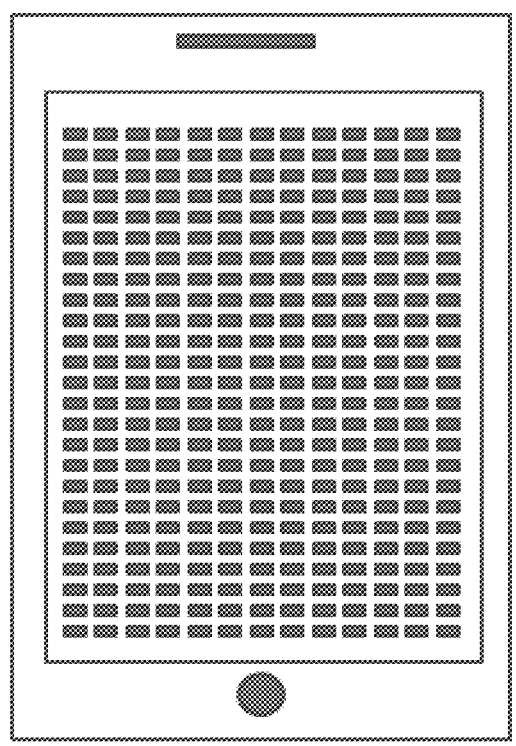
FIG. 3 is a schematic diagram of a capacitance matrix for fingerprint recognition in an embodiment of the present invention.

In order that those skilled in the art will better understand the technical solutions of the present invention, the technical solutions in the examples of the present invention will be clearly and completely described below with reference to the accompanying drawings in the examples of the present invention. The examples described herein are embodiments of the present invention. All other examples obtained by those of ordinary skill in the art based on the examples of the present invention should fall within the scope of the present invention.

An AMOLED driving circuit in the prior art comprises a plurality of AMOLED driving units, as shown in FIG. 1, each driving unit comprises two thin film transistors (a first thin film transistor T1 and a second thin film transistor T2), a capacitor Cs and an OLED, wherein:

the gate of the first thin-film transistor T1 is connected with a transverse scanning signal line, the scanning signal line supplies a switching voltage Vsel, and the switching voltage Vsel is a switching voltage of the first thin-film transistor T1. When the scanning line is selected, the first thin-film transistor T1 is turned on, and the current is conducted; the source of the first thin film transistor T is connected with a longitudinal signal line, and the drain is connected with the second thin film transistor T2;

the gate of the second thin film transistor T2 is connected with the drain of the first thin film transistor T1, the source is connected with a high level Vdd of an anode, and the drain is connected with the OLED.

A signal line with which the first thin film transistor T1 is connected supplies a driving voltage Vdata, and the driving voltage Vdata can drive the second thin film transistor T2 to be turned on when the first thin film transistor T1 is turned on.

The AMOLED driving unit also comprises an OLED, both ends of which are respectively connected with the drain of the second thin film transistor T2 and a cathode terminal.

Further, the capacitor Cs is connected between the gate and the source of the second thin-film transistor T2, and is in a charging state when the second thin-film transistor T2 is not turned on; after T2 is turned on, to reduce the driving power consumption of Vdata, the stored electric quantity of Cs is used to drive the second thin film transistor T2 and simultaneously lighten the OLED.

The source and the gate of the first thin-film transistor T1 may be swapped, the source and the drain of the second thin-film transistor T2 may be swapped, and it will not be described in detail herein.

In one embodiment of the present invention, an AMOLED and fingerprint recognition-based driving and scanning circuit comprises a plurality of driving and scanning units which may be distributed in an array, and the driving and scanning units may be improved on the basis of the existing AMOLED driving units.

As shown in FIG. 2, each driving and scanning unit may comprise an AMOLED driving unit for driving an OLED to emit light and a fingerprint scanning unit for forming pixel capacitances, wherein:

the AMOLED driving unit comprises a first thin film transistor T1, a second thin film transistor T2, a third thin film transistor T3, and an OLED. The first thin film transistor T1 is connected with a first driving voltage Vdata1 and a first switching voltage Vsel1, the second thin film transistor T2 and the third thin film transistor T3 are respectively connected with an anode terminal and a cathode terminal, and the OLED is positioned between the cathode terminal and the second thin film transistor T2;

the cathode terminal also comprises a fourth thin film transistor T4, and the fourth thin film transistor T4 may be connected with a second driving voltage Vdata2 and a second switching voltage Vsel2;

one and only one of the AMOLED driving unit and the fingerprint scanning unit in the present invention may be in a conducting state, comprising:

a first state, the first driving voltage Vdata1 and the first switching voltage Vsel1 controlling the first thin film transistor T1, the second thin film transistor T2 and the third thin film transistor T3 to be turned on, the second driving voltage Vdata2 and the second switching voltage Vsel2 controlling the fourth thin film transistor T4 to be cut off, and the AMOLED driving unit driving the OLED to be turned on to emit light; and a second state, the first driving voltage Vdata1 and the first switching voltage Vsel1 controlling the first thin film transistor T1, the second thin film transistor T2 and the third thin film transistor T3 to be cut off, the second driving voltage Vdata2 and the second switching voltage Vsel2 controlling the fourth thin film transistor T4 to be turned on, and the fourth thin film transistor T4 forming the pixel capacitances for fingerprint recognition.

In the AMOLED driving unit of an embodiment:
the gate of the first thin film transistor T1 may be connected with the first switching voltage Vsel1, and the source and the drain may be respectively connected with the first driving voltage Vdata1 and the second thin film transistor T2;

the gate of the second thin film transistor T2 may be connected with the first thin film transistor T1, and the source and the drain ape may be respectively connected with a high level Vdd of an anode and the OLED;

the gate of the third thin film transistor T3 may be connected with the gate of the second thin film transistor T2, the source and the drain may be respectively connected with the OLED and a low level of a cathode, and the low level of the cathode may have a grounding (GND) zero level.

In an embodiment, in the fingerprint scanning unit:

the gate of the fourth thin film transistor T4 may be connected with the second switching voltage Vsel2, and the source and the drain may be respectively connected with the OLED and the second driving voltage Vdata2.

In an embodiment, a capacitor Cs for driving the second thin film transistor can be arranged between the gate of the second thin film transistor T2 and the high level Vdd of the anode, the capacitor Cs may have the same function with the capacitor Cs in the AMOLED driving circuit in the prior art, and Cs is in a charging state when the second thin-film transistor T2 is not turned on; after T2 is turned on, to reduce the driving power consumption of Vdata1, the stored electric quantity of Cs can be used to drive the second thin film transistor T2 and simultaneously lighten the OLED.

In an embodiment, the first switching voltage Vsel1 and the first driving voltage Vdata1 can be respectively connected with a first scanning line (not shown) and a first signal line (not shown), and the second switching voltage Vsel2 and the second driving voltage Vdata2 can be respectively connected with a second scanning line (not shown) and a second signal line (not shown).

In an embodiment, the operation principle of the AMOLED and fingerprint recognition-based driving and scanning circuit is may be specifically as follows:

when the first switching voltage Vsel1 and the first driving voltage Vdata1 are selected, the first thin film transistor T1, the second thin film transistor T2, and the third thin film transistor T3 are turned on, the fourth thin film transistor T4 is cut off, the cathode terminal is grounded, and the OLED is in a conductive light-emitting state;

when the second switching voltage Vsel2 and the second driving voltage Vdata2 are selected, the first thin film transistor T1, the second thin film transistor T2, and the third thin film transistor T3 can be cut off, the fourth thin film transistor T4 can be turned on, the cathode terminal is a fingerprint electrode induction terminal (sensor scanning terminal), and a plurality of cathode terminals distributed in an array forms a fingerprint scanning matrix at the moment. As shown in FIG. 3, the driving and scanning circuit can form a capacitance matrix of pixels per unit needed by the fingerprint at this moment, and then a self-capacitance algorithm can be used to acquire the fingerprint and match, and conduct unlocking and payment operations. The self-capacitance algorithm is a commonly used algorithm in fingerprint recognition, as described in the Chinese patent CN104808886A, so it will not be repeated herein.

An another embodiment of the present invention also discloses a display screen, comprising a cathode layer, an anode layer, an organic light-emitting layer, and the above-mentioned driving and scanning circuit.

A still further embodiment of the present invention discloses a mobile terminal, comprising the above-mentioned driving and scanning circuit. The mobile terminal may comprise a driving display state and a fingerprint scanning state, wherein:

when the mobile terminal is in a driving display state, the AMOLED driving unit in the driving and scanning circuit in the display screen of the mobile terminal can be used to drive the OLED to emit light to realize the display function of the mobile terminal;

when the mobile terminal is in a fingerprint scanning state, the fingerprint scanning unit in the driving and scanning circuit in the display screen of the mobile terminal can form[[s]] a capacitance matrix of pixels per unit needed by the fingerprint, and the fingerprint can be acquired by using a capacitance algorithm so as to realize the fingerprint recognition and related effective action in any display area of the mobile terminal.

The mobile terminal in the present invention includes, but is not limited to, an electronic device such as a mobile phone, a tablet, and a tablet computer.

As can be seen from the above embodiments, the fingerprint scanning unit can be added at the cathode terminal of the AMOLED driving circuit in the driving scanning circuit of the present invention, so that the driving display function of the AMOLED can not only be realized but also the fingerprint recognition function can be realized; and the fingerprint recognition and the effective operations related to the fingerprint recognition can be realized in any area of the display panel.

It will be apparent to those skilled in the art that the present invention is not limited to the details of the above-described exemplary examples, and that the present invention may be embodied in other forms without departing from the spirit or essential characteristics of the present invention. The present examples are therefore to be considered in all respects as illustrations and not limitations, and the scope of the invention may be defined by the appended claims rather than by the foregoing description, and may therefore be intended to enable all changes falling within the meanings and ranges of the claims to be included in the present invention. Any reference signs of the appended drawings in the claims shall not be construed as limiting the claims involved.

In addition, it should be understood that while the present invention is described in terms of embodiments, not every embodiment includes only a single technical solution, and the present invention is described herein in this way for clarity only; a person skilled in the art should refer to the specification as a whole, and other embodiments understood by those skilled in the art can be formed by appropriate combinations of the technical solutions in the above embodiments.

What is claimed is:

1. A driving and scanning circuit, comprising:
    a plurality of driving and scanning units which are distributed in an array, wherein each driving and scanning unit comprises an AMOLED driving unit for driving an OLED to emit light and a fingerprint scanning unit for forming pixel capacitances, wherein
    the AMOLED driving unit comprises a first thin film transistor, a second thin film transistor, a third thin film transistor and an OLED, the first thin film transistor is connected with a first driving voltage and a first switching voltage, the second thin film transistor and the third thin film transistor are respectively connected with an anode terminal and a cathode terminal, and the OLED is positioned between the cathode terminal and the second thin film transistor;
    the cathode terminal comprises a fourth thin film transistor, and the fourth thin film transistor is connected with a second driving voltage and a second switching voltage;

one and only one of the AMOLED driving unit and the fingerprint scanning unit is in a conducting state;

in the fingerprint scanning unit: a gate of the fourth thin film transistor is connected with the second switching voltage, and a source and a drain are respectively connected with the OLED and the second driving voltage; the first switching voltage and the first driving voltage are respectively connected with a first scanning line and a first signal line, and the second switching voltage and the second driving voltage are respectively connected with a second scanning line and a second signal line.

2. The driving and scanning circuit as set forth in claim 1, wherein the driving and scanning circuit includes:

a first state, the first driving voltage and the first switching voltage controlling the first thin film transistor, the second thin film transistor and the third thin film transistor to be turned on, the second driving voltage and the second switching voltage controlling the fourth thin film transistor to be cut off, and the AMOLED driving unit driving the OLED to be turned on to emit light; and a second state, the first driving voltage and the first switching voltage controlling the first thin film transistor, the second thin film transistor and the third thin film transistor to be cut off, the second driving voltage and the second switching voltage controlling the fourth thin film transistor to be turned on, and the fourth thin film transistor forming pixel capacitances for fingerprint recognition.

3. The driving and scanning circuit as set forth in claim 1, wherein in the AMOLED driving unit:

a gate of the first thin film transistor is connected with the first switching voltage, and the source and the drain are respectively connected with the first driving voltage and the second thin film transistor;

a gate of the second thin film transistor is connected with the first thin film transistor, and the source and the drain are respectively connected with a high level of an anode and the OLED;

a gate of the third thin film transistor is connected with the gate of the second thin film transistor, and the source and the drain are respectively connected with the OLED and a low level of a cathode.

4. The driving and scanning circuit as set forth in claim 3, wherein the low level of the cathode is a grounding zero level.

5. The driving and scanning circuit as set forth in claim 3, wherein a capacitor for driving the second thin film transistor is arranged between the gate of the second thin film transistor and the high level of the anode.

6. A display screen, wherein the display screen comprises a cathode layer, an anode layer, an organic light-emitting layer, and a driving and scanning circuit, wherein the driving and scanning circuit comprises a plurality of driving and scanning units which are distributed in an array, wherein each driving and scanning unit comprises an AMOLED driving unit for driving an OLED to emit light and a fingerprint scanning unit for forming pixel capacitances;

the AMOLED driving unit comprises a first thin film transistor, a second thin film transistor, a third thin film transistor and an OLED, wherein the first thin film transistor is connected with a first driving voltage and a first switching voltage, the second thin film transistor and the third thin film transistor are respectively connected with an anode terminal and a cathode terminal, and the OLED is positioned between the cathode terminal and the second thin film transistor; the cathode terminal comprises a fourth thin film transistor, and the fourth thin film transistor is connected with a second driving voltage and a second switching voltage; and one and only one of the AMOLED driving unit and the fingerprint scanning unit is in a conducting state.

7. The display screen as set forth in claim 6, wherein the driving and scanning circuit includes:

a first state, the first driving voltage and the first switching voltage controlling the first thin film transistor, the second thin film transistor and the third thin film transistor to be turned on, the second driving voltage and the second switching voltage controlling the fourth thin film transistor to be cut off, and the AMOLED driving unit driving the OLED to be turned on to emit light; and a second state, the first driving voltage and the first switching voltage controlling the first thin film transistor, the second thin film transistor and the third thin film transistor to be cut off, the second driving voltage and the second switching voltage controlling the fourth thin film transistor to be turned on, and the fourth thin film transistor forming pixel capacitances for fingerprint recognition.

8. The display screen as set forth in claim 6, wherein in the AMOLED driving unit:

a gate of the first thin film transistor is connected with the first switching voltage, and a source and a drain are respectively connected with the first driving voltage and the second thin film transistor;

a gate of the second thin film transistor is connected with the first thin film transistor, and the source and the drain are respectively connected with a high level of an anode and the OLED;

a gate of the third thin film transistor is connected with the gate of the second thin film transistor, and the source and the drain are respectively connected with the OLED and a low level of a cathode.

9. The display screen as set forth in claim 8, wherein a capacitor for driving the second thin film transistor is arranged between the gate of the second thin film transistor and the high level of the anode.

10. The display screen as set forth in claim 6, wherein the first switching voltage and the first driving voltage are respectively connected with a first scanning line and a first signal line, and the second switching voltage and the second driving voltage are respectively connected with a second scanning line and a second signal line; in the fingerprint scanning unit: a gate of the fourth thin film transistor is connected with the second switching voltage, and the source and the drain are respectively connected with the OLED and the second driving voltage.

11. A mobile terminal, wherein the mobile terminal comprises a driving and scanning circuit, and the driving and scanning circuit comprises a plurality of driving and scanning units which are distributed in an array, wherein each driving and scanning unit comprises an AMOLED driving unit for driving an OLED to emit light and a fingerprint scanning unit for forming pixel capacitances;

the AMOLED driving unit comprises a first thin film transistor, a second thin film transistor, a third thin film transistor and an OLED, the first thin film transistor is connected with a first driving voltage and a first switching voltage, the second thin film transistor and the third thin film transistor are respectively connected with an anode terminal and a cathode terminal, and the OLED is positioned between the cathode terminal and the second thin film transistor; the cathode terminal also comprises a fourth thin film transistor, and the fourth thin film transistor is connected with a second driving voltage and a second switching voltage; and one and only one of the AMOLED driving unit and the fingerprint scanning unit is in a conducting state.

12. The mobile terminal as set forth in claim 11, wherein the driving and scanning circuit includes:
  a first state, the first driving voltage and the first switching voltage controlling the first thin film transistor, the second thin film transistor and the third thin film transistor to be turned on, the second driving voltage and the second switching voltage controlling the fourth thin film transistor to be cut off, and the AMOLED driving unit driving the OLED to be turned on to emit light; and
  a second state, the first driving voltage and the first switching voltage controlling the first thin film transistor, the second thin film transistor and the third thin film transistor to be cut off, the second driving voltage and the second switching voltage controlling the fourth thin film transistor to be turned on, and the fourth thin film transistor forming pixel capacitances for fingerprint recognition.

13. The mobile terminal as set forth in claim 11, wherein in the AMOLED driving unit:
  a gate of the first thin film transistor is connected with the first switching voltage, and a source and a drain are respectively connected with the first driving voltage and the second thin film transistor;
  a gate of the second thin film transistor is connected with the first thin film transistor, and the source and the drain are respectively connected with a high level of an anode and the OLED;
  a gate of the third thin film transistor is connected with the gate of the second thin film transistor, and the source and the drain are respectively connected with the OLED and a low level of a cathode.

14. The mobile terminal as set forth in claim 13, wherein a capacitor for driving the second thin film transistor is arranged between the gate of the second thin film transistor and the high level of the anode; in the fingerprint scanning unit: the gate of the fourth thin film transistor is connected with the second switching voltage, and the source and the drain are respectively connected with the OLED and the second driving voltage.

15. The mobile terminal as set forth in claim 11, wherein the mobile terminal includes a driving display state and a fingerprint scanning state, wherein:
  when the mobile terminal is in the driving display state, the AMOLED driving unit in the driving and scanning circuit is used to drive the OLED to emit light to realize the display function of the mobile terminal;
  when the mobile terminal is in the fingerprint scanning state, the fingerprint scanning unit in the driving and scanning circuit forms a capacitance matrix of pixels per unit needed by the fingerprint scanning unit, and a fingerprint is acquired by using a capacitance algorithm to realize fingerprint recognition and related effective action in any display area of the mobile terminal.

16. The driving and scanning circuit of claim 1, wherein the fingerprint scanning unit is positioned at a cathode terminal of the AMOLED driving unit.

17. The driving and scanning circuit of claim 2, wherein the fingerprint recognition is operational at every point on a display screen.

18. The display screen of claim 6, wherein the fingerprint scanning unit is positioned at a cathode terminal of the AMOLED driving unit.

19. The display screen of claim 7, wherein the fingerprint recognition is operational at every point on the display screen.

20. The mobile terminal of claim 11, wherein the fingerprint scanning unit is positioned at a cathode terminal of the AMOLED driving unit.

* * * * *